United States Patent
Gu et al.

(10) Patent No.: US 9,806,879 B2
(45) Date of Patent: Oct. 31, 2017

(54) BURST MODE CLOCK DATA RECOVERY DEVICE AND METHOD THEREOF

(71) Applicant: Realtek Semiconductor Corp., Hsinchu (TW)

(72) Inventors: Lijun Gu, Chiang Su Sheng Su Chou (CN); Ming Li, Chiang Su Sheng Su Chou (CN); Ling Chen, Chiang Su Sheng Nan Tung (CN)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/159,146

(22) Filed: May 19, 2016

(65) Prior Publication Data

US 2016/0352504 A1    Dec. 1, 2016

(30) Foreign Application Priority Data

May 28, 2015   (CN) .......................... 2015 1 0282379

(51) Int. Cl.

| | |
|---|---|
| *H04L 7/10* | (2006.01) |
| *H04L 7/00* | (2006.01) |
| *H03L 7/10* | (2006.01) |
| *H04L 7/033* | (2006.01) |

(52) U.S. Cl.
CPC .............. *H04L 7/0087* (2013.01); *H03L 7/10* (2013.01); *H04L 7/0004* (2013.01); *H04L 7/033* (2013.01); *H04L 7/0025* (2013.01)

(58) Field of Classification Search
CPC ..... H04L 7/0087; H04L 7/0004; H04L 7/033; H04L 7/0025; H03L 7/10
See application file for complete search history.

(56) References Cited

U.S. PATENT DOCUMENTS

| | | | | |
|---|---|---|---|---|
| 6,215,834 B1* | 4/2001 | McCollough | ............. | G06F 1/04 331/14 |
| 6,275,553 B1* | 8/2001 | Esaki | ........................ | H03L 7/23 327/147 |
| 7,039,149 B2* | 5/2006 | Tagami | ................... | H04L 7/033 327/156 |
| 7,576,576 B2* | 8/2009 | Drexler | ..................... | H03L 7/07 327/147 |
| 8,666,010 B1* | 3/2014 | Novellini | .................. | H04L 7/02 327/147 |
| 8,671,305 B1 | 3/2014 | Shih et al. | | |

(Continued)

*Primary Examiner* — Dac Ha
(74) *Attorney, Agent, or Firm* — Muncy, Geissler, Olds & Lowe, P.C.

(57) ABSTRACT

A burst mode clock data recovery device includes a clock data recovery loop, a frequency tracking loop, a frequency tracking loop, and a fast-locking unit. The clock data recovery loop receives a sampling clock signal and a data signal and uses the sampling clock signal to lock the data signal to generate a recovery clock signal. The frequency tracking loop tracks a frequency of the recovery clock signal to generate a frequency detection signal associated with the recovery clock signal. The phase lock loop receives the frequency detection signal and locks the recovery clock signal in a reference clock. The fast-locking unit generates a fast-locking signal according to the recovery clock signal and a first phase detection signal to allow the clock data recovery loop to quickly lock the data signal after the transition from a stall mode to the burst mode.

8 Claims, 11 Drawing Sheets

(56) References Cited

U.S. PATENT DOCUMENTS

2015/0061737 A1\* 3/2015 Abbasi .................. H03L 7/1075
327/157
2016/0204787 A1\* 7/2016 Lotfy ...................... H03L 7/085
327/142

\* cited by examiner

| Dn | En | Dn+1 | up(n)/dn(n) | up(n)/dn(n) |
|---|---|---|---|---|
| 0 | 0 | 0 | 0 0 | phase no up, no down |
| 0 | 0 | 1 | 0 1 | phase dn |
| 0 | 1 | 0 | 0 0 | phase no up, no down |
| 0 | 1 | 1 | 1 0 | phase up |
| 1 | 0 | 0 | 1 0 | phase up |
| 1 | 0 | 1 | 0 0 | phase no up, no down |
| 1 | 1 | 0 | 0 1 | phase dn |
| 1 | 1 | 1 | 0 0 | phase no up, no down |

FIG. 3C

| data edge(n) | data(n+1) | up(n)/dn(n) | dout=data(n) |
|---|---|---|---|
| 0 | 0 | 0 0 | 0 |
| 0 | 1 | 0 1 | 0 |
| 1 | 0 | 0 0 | 0 |
| 1 | 1 | 1 0 | 0 |
| 0 | 0 | 1 0 | 1 |
| 1 | 1 | 0 0 | 1 |
| 1 | 0 | 0 1 | 1 |
| 1 | 1 | 0 0 | 1 |

FIG. 4D

BURST MODE CLOCK DATA RECOVERY DEVICE AND METHOD THEREOF

BACKGROUND a. Field of the Invention

The invention relates generally to an electronic device, and more particularly, to a burst-mode clock data recovery device and method.

b. Description of the Related Art

FIG. 1 shows a schematic diagram illustrating a conventional clock data recovery device. As shown in FIG. 1, the clock data recovery device 100 includes a phase detector 101, a charge pump 102, a voltage-controlled oscillator 103, and a low-pass filter 104. The phase detector 101 detects a phase difference among data signals data1 to generate a phase detection signal de according to a recovery clock signal ckr. The charge pump 102 generates a voltage control signal vc1, according to the phase detection signal de. The voltage-controlled oscillator 103 generates the recovery clock signal ckr according to the voltage control signal vc1, and the voltage control signal vc1 is low-pass filtered by the low-pass filter 104.

However, since the clock data recovery device 100 is required to relock the phase and frequency when exiting a stall mode, it may cost considerable time and thus lower the speed.

Therefore, it is desirable to provide a clock data recovery device and a method capable of fast locking phase and frequency.

BRIEF SUMMARY OF THE INVENTION

The invention relates, in one embodiment, to a clock data recovery device and method capable of quickly locking phase and frequency under a burst mode.

In one aspect, a clock data recovery device includes a clock data recovery loop, a frequency tracking loop, a frequency tracking loop, and a fast-locking unit. The clock data recovery loop receives a sampling clock signal and a data signal and uses the sampling clock signal to lock the data signal to generate a recovery clock signal. The frequency tracking loop is coupled to the clock data recovery loop for tracking a frequency of the recovery clock signal to generate a frequency detection signal associated with the recovery clock signal. The phase lock loop is coupled to the clock data recovery loop and the frequency tracking loop for receiving the frequency detection signal and locking the recovery clock signal in a reference clock. The fast-locking unit is coupled to the clock data recovery loop for generating a fast-locking signal under a burst mode according to the recovery clock signal and a first phase detection signal to allow the clock data recovery loop to quickly lock the data signal after the transition from a stall mode to the burst mode.

According to another aspect of the invention, a method for locking a recovery clock signal includes the steps of: setting an initial fractional number for generating a recovery clock signal locked in an initial frequency; receiving a data signal; tracking the recovery clock signal to generate an accurate fractional number; entering a stall mode, where the recovery clock signal and the data signal still having an identical frequency when the data signal stops being transmitted; scanning a plurality of the recovery clock signals when the data signal turns to be transmitted again and adjusting a phase of a sampling clock signal relying on information of phase-leading or phase-lag of the plurality of the recovery clock signals with respect to the data signal to align with a temporal position of the data signal and generate a preset phase; and generating a sample clock for the data signal according to the preset phase when entering a burst mode.

According to another aspect of the invention, a method for locking a recovery clock signal includes the steps of: setting an initial fractional number for generating a recovery clock signal locked in an initial frequency; receiving a data signal; tracking the recovery clock signal to generate an accurate fractional number; entering a stall mode, where the recovery clock signal and the data signal still having an identical frequency when the data signal stops being transmitted; when the data signal turns to be transmitted again, using multiple phases of multiple recovery clock signals generated by a voltage-controlled oscillator to fetch the data signal to obtain multiple edge positions and middle positions of data of the data signal, and selecting one of the multiple phases as a preset phase according to the multiple edge positions and middle positions of data; and generating a sample clock for the data signal according to the preset phase when entering a burst mode.

According to the above embodiments, since a preset phase may serve as an initial phase for an oscillation frequency of a clock data recovery circuit, the clock data recovery loop can be quickly locked to resolve the problems of conventional designs.

Other features and advantages of the present invention will immediately be recognized by persons of ordinary skill in the art with reference to the attached drawings and detailed description of exemplary embodiments as given below.

BRIEF DESCRIPTION OF THE DRAWINGS

FIG. 3C shows a truth table of the embodiment of FIG. 3A.

FIG. 4D shows a truth table of the embodiment of FIG. 4A.

DETAILED DESCRIPTION OF THE INVENTION

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that"A" component directly faces "B" component or one or more additional components are between"A" component and "B" component. Also, the description of"A" component "adjacent to""B" component herein may contain the situations that"A" component is directly "adjacent to" "B" component or one or more additional components are between "A" component and "B" component. Accordingly, the drawings and descriptions will be regarded as illustrative in nature and not as restrictive.

Figure 1:
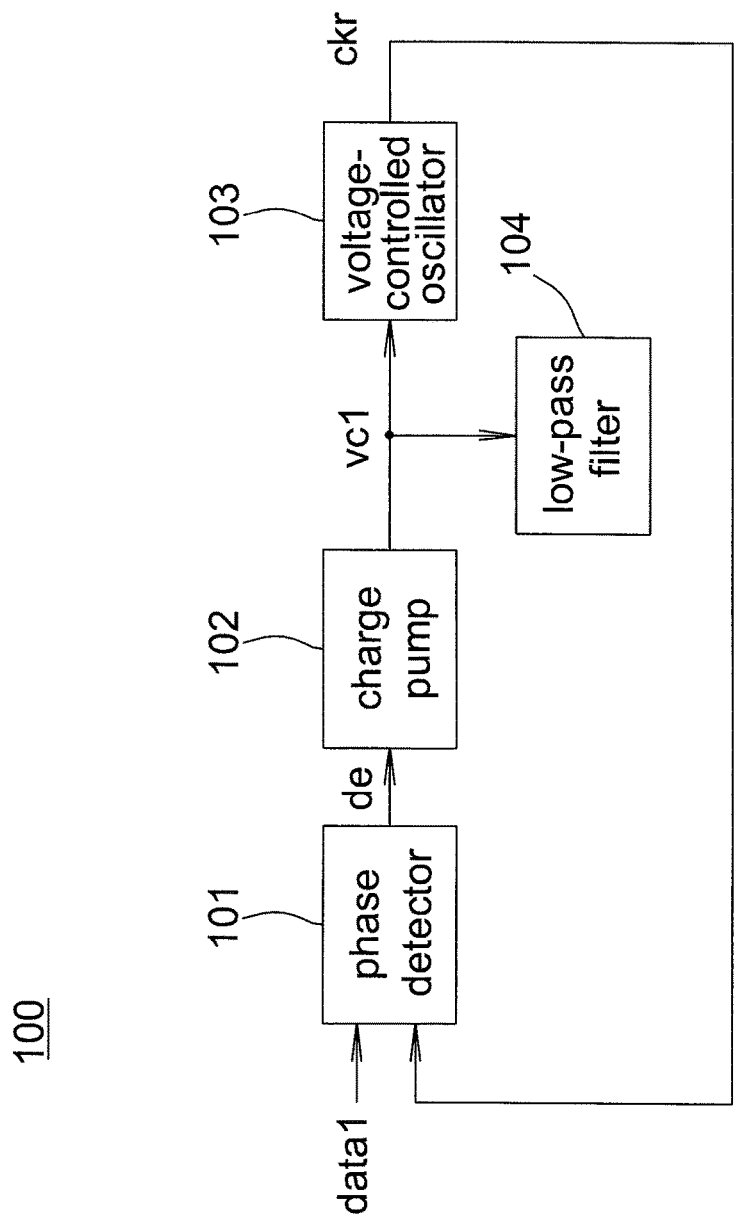
FIG. 1 shows a schematic diagram illustrating a conventional clock data recovery device.
Figure 2:
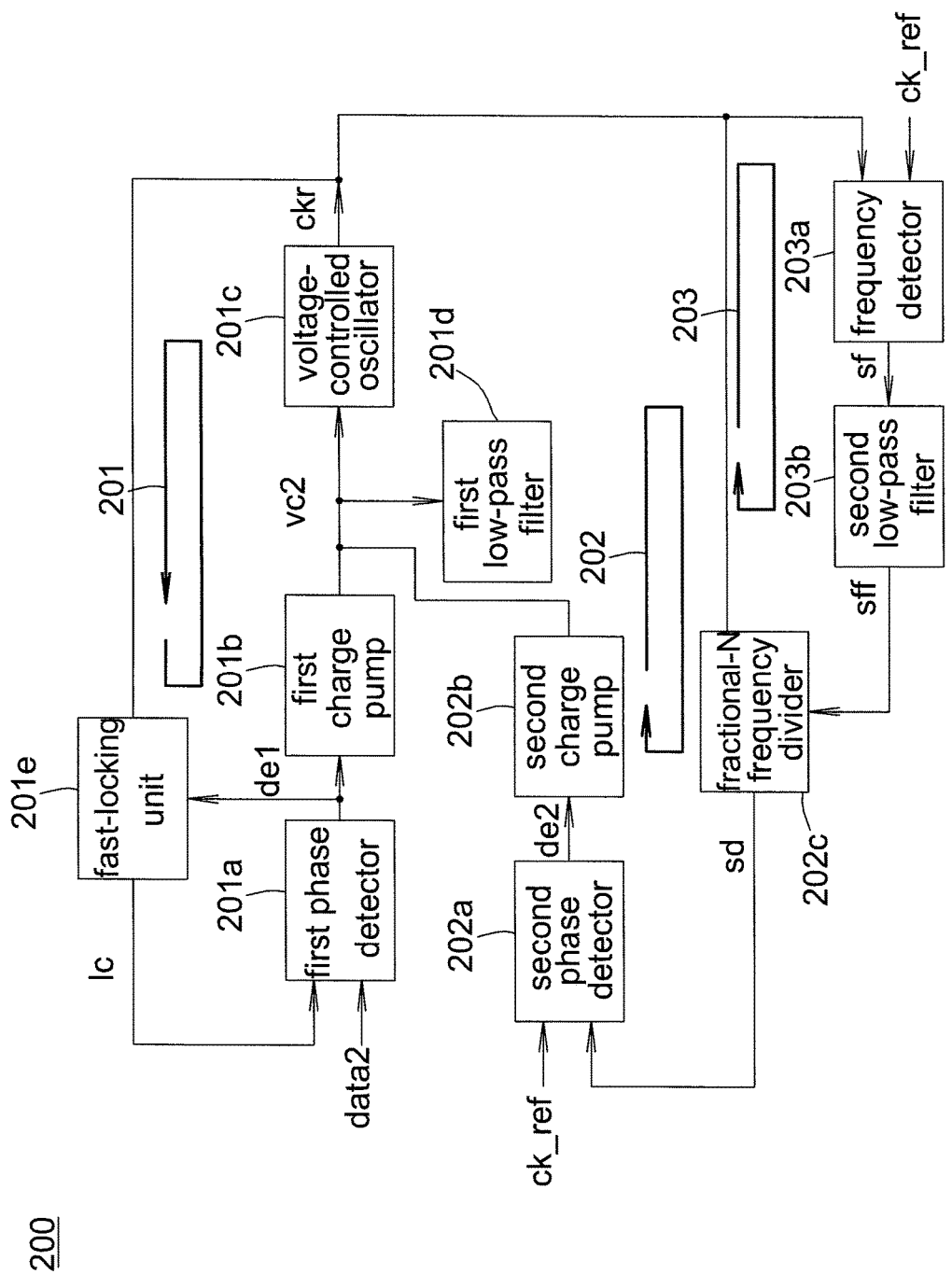
FIG. 2 shows a schematic diagram illustrating a burst mode clock data recovery device according to an embodiment of the invention.

FIG. 2 shows a schematic diagram illustrating a burst mode clock data recovery device according to an embodiment of the invention. As illustrated in FIG. 2, the burst mode clock data recovery device 200 may include a clock data recovery loop 201, a phase lock loop 202, and a frequency tracking loop 203.

The clock data recovery loop 201 may include a first phase detector 201a, a first charge pump 201b, a voltage-controlled oscillator 201c, a first low-pass filter 201d, and a fast-locking unit 201e. The clock data recovery loop 201 may receive and lock a data signal data2 to generate a recovery clock signal ckr according to a sampling clock signal lc generated by the fast-locking unit 201e.

The first phase detector 201a may detect a phase difference between a sampling clock signal 1c and an input data signal data2 to generate a first phase detection signal de1. The first charge pump 201b may generate a voltage control signal vc2 according to the first phase detection signal de1. The voltage-controlled oscillator 201c may generate a recovery clock signal ckr according to the voltage control signal vc2. The first low-pass filter 201d may perform a low-pass filtering operation on the voltage control signal vc2. Further, based on the recovery clock signal ckr and the first phase detection signal de1, the fast-locking unit 201e may, under a burst mode, generate a fast-locking signal lc to allow the clock data recovery loop 201 to precisely lock phase and frequency of the data signal data2 after the transition from a stall mode to the burst mode.

The phase lock loop 202 may include a second phase detector 202a, a second charge pump 202b, and a fractional-N frequency divider 202c. The phase lock loop 202 may lock the recovery clock signal ckr in a reference clock ck_ref. The second phase detector 202a may receive a reference clock ck_ref and a frequency division signal sd and may generate a second phase detection signal de2 according to a phase difference between the reference clock ck_ref and the frequency division signal sd. The second charge pump 202b may generate a voltage control signal vc2 according to the second phase detection signal de2. The fractional-N frequency divider 202c may receive the recovery clock signal ckr and a filtered frequency detection signal sff and generate a frequency division signal sd according to the recovery clock signal ckr and the filtered frequency detection signal sff.

The frequency tracking loop 203 may include a frequency detector 203a and a second low-pass filter 203b. The frequency tracking loop 203 may track the frequency of the recovery clock signal ckr. The frequency detector 203a may receive the reference clock ck_ref and detect the frequency of the recovery clock signal ckr to generate a frequency detection signal sf according to the reference clock ck_ref. The second low-pass filter 203b may filter the frequency detection signal sf to generate a filtered frequency detection signal ssf. Note the filtered frequency detection signal ssf is associated with the recovery clock signal ckr and may reflect the recovery clock signal ckr and the adjustment performed thereon.

Figure 6:
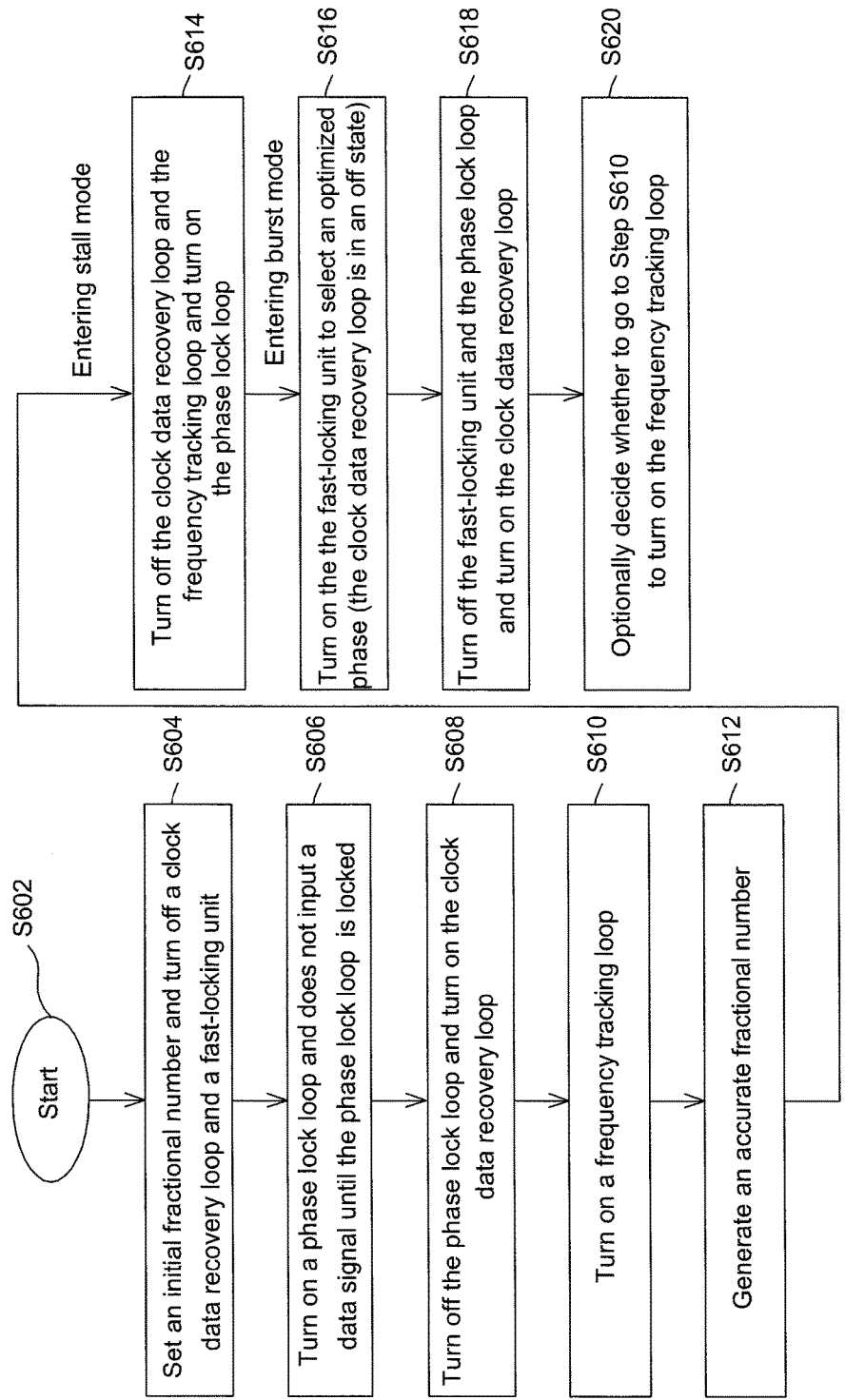
FIG. 6 shows a flow chart illustrating operations for a burst mode clock data recovery device according to an embodiment of the invention.

FIG. 6 shows a flow chart illustrating operations for a burst mode clock data recovery device 200 according to an embodiment of the invention. The fast locking procedure may include the following steps.

Step S602: Start.

Step S604: Set an initial fractional number for a fractional-N frequency divider 203e, and turn off a clock data recovery loop 201 and a fast-locking unit 201e. At this time, a first phase detector 201a, a first charge pump 201b, a first low-pass filter 201d and the fast-locking unit 201e in the clock data recovery loop 201 are all in an off state.

Step S606: Turn on a phase lock loop 202, where a data signal data2 is not input into the phase lock loop 202 until the phase lock loop 202 is locked. A second phase detector 202 of the phase lock loop 202 may receive a reference clock ck_ref and a frequency division signal sd with an initial value. The phase of an output second detection signal de2 may be locked in the phase of the reference clock ck_ref, and the second charge pump 202b may generate a voltage control signal vc2 according to the second detection signal de2. The voltage control signal vc2 controls a voltage-controlled oscillator 201c to allow the voltage-controlled oscillator 201C to operate at an initial preset frequency. Then, the data signal data2 begins to enter the first phase detector 201a of the clock data recovery loop 201.

Step S608: Turn off the phase lock loop 202 and turn on the clock data recovery loop 201. At this time, the fast-locking unit 201e is still in an off state, and the second phase detector 202a, the second charge pump 202b and the fractional-N frequency divider 202c of the phase lock loop 202 are in an off state. In comparison, the clock data recovery loop 201 except for the fast-locking unit 201e begins to operate. In one embodiment, the first phase detector 201a of the clock data recovery loop 201 receives the data signal data2 to generate a first detection signal de1. At this time, a sampling clock signal lc is set to have an initial constant phase difference with respect to a recovery clock signal ckr. Then, the first charge pump 201b receives the first detection signal de1 to generate a voltage control signal vc2. The voltage-controlled oscillator 201c generates the recovery clock signal ckr according to the voltage control signal vc2, thus enabling the operating fast-locking unit 201e to generate a sampling clock signal lc to lock the data signal data2.

Step S610: Turn on a frequency tracking loop 203. In one embodiment, the frequency detector 203a may receive the reference clock ck_ref and detect a frequency of the recovery clock signal ckr according to the reference clock ck ref to generate a frequency detection signal sf. The second low-pass filter 203b may filter the frequency detection signal sf to generate a filtered frequency detection signal ssf provided for the fractional-N frequency divider 202.

Step S612: Generate an accurate fractional number. In one embodiment, the fractional-N frequency divider 202 may generate the accurate fractional number according to the filtered frequency detection signal ssf.

Step S614: Enter a stall mode when the data signal data2 stops entering the clock data recovery loop 201. When the burst mode clock data recovery device 200 is turned off according to preset criteria, the clock data recovery loop 201 is turned off, the frequency tracking loop 203 is turned off and the phase lock loop 202 is turned on.

Step S616: Enter a burst mode when the data signal data2 recovers to enter the clock data recovery loop 201. At this time, the fast-locking unit 201e is turned on to select an optimized phase, and the clock data recovery loop 201 is still in an off state.

Figure 3A:
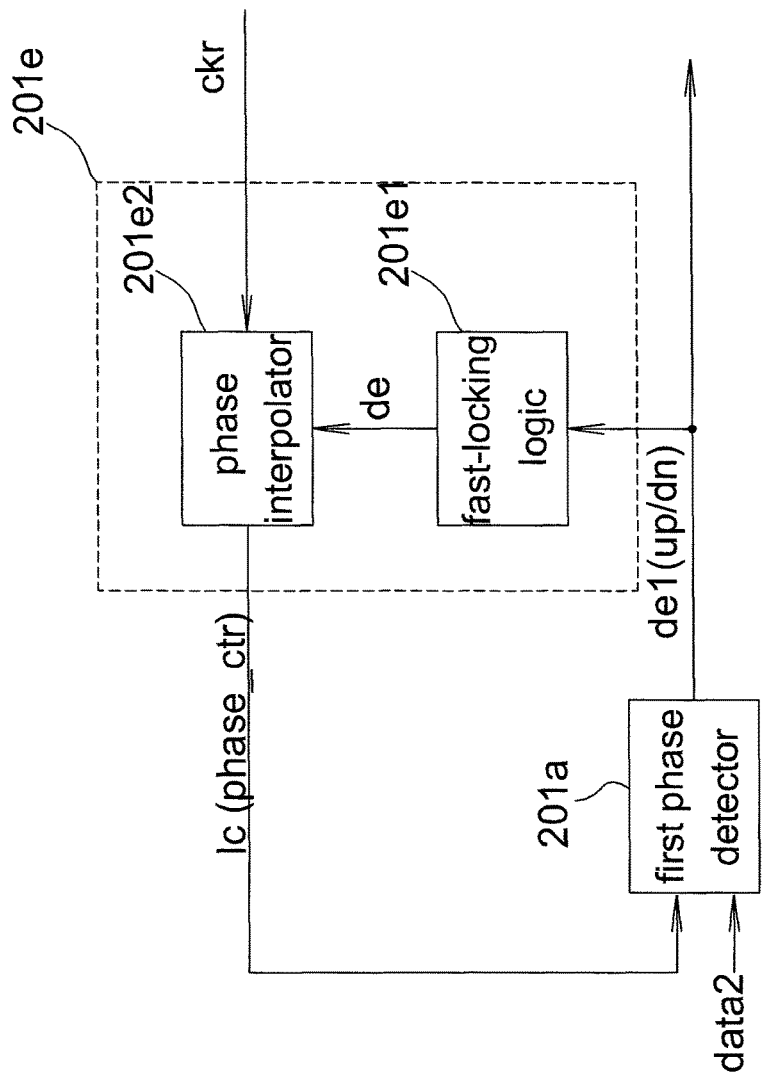
FIG. 3A shows a schematic diagram illustrating a fast-locking unit according to an embodiment of the invention.

In one embodiment, as shown in FIG. 3A, the fast-locking unit 201e includes a fast-locking logic 201e1 and a phase interpolator 201e2.

Figure 3B:
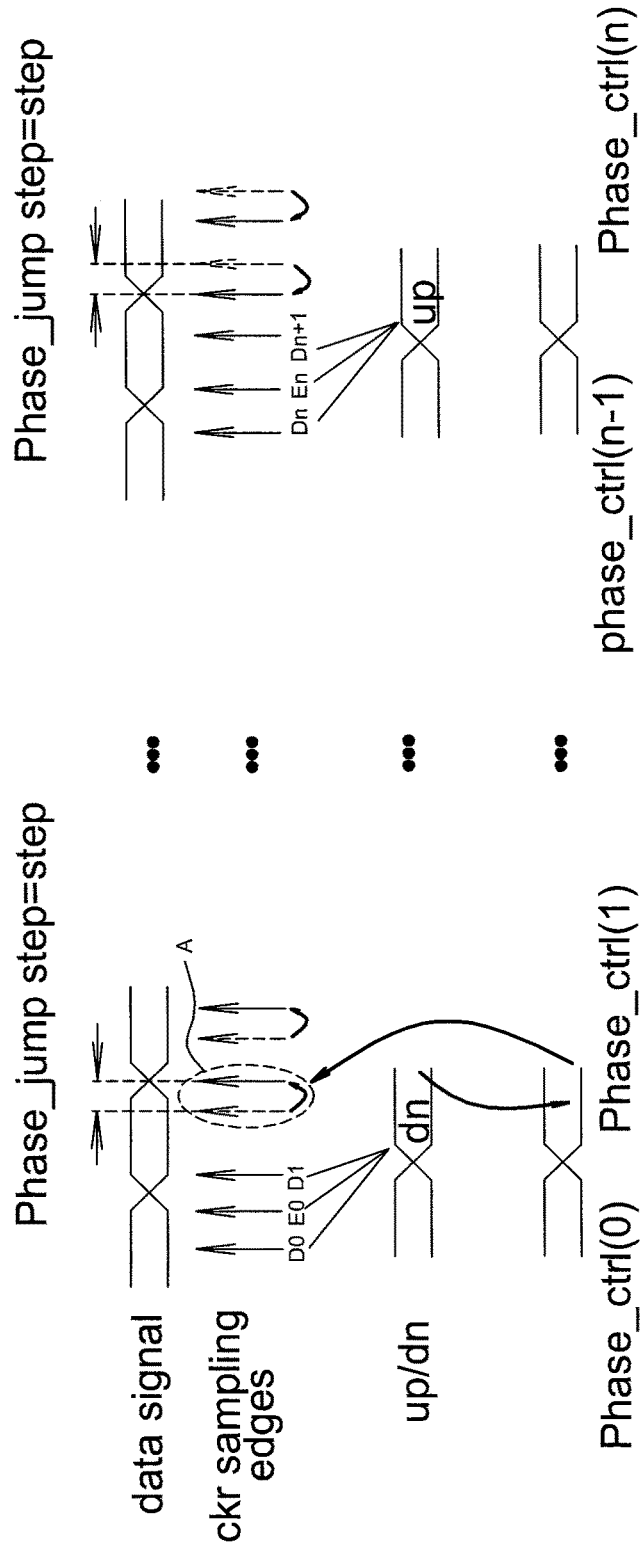
FIG. 3B is a logical flow diagram illustrating one embodiment of signal locking operations for the fast-locking unit of FIG. 3A.

The fast-locking unit 201e1 relies on a first phase detection signal de1 that indicates phase-leading or phase-lag of a sampling clock signal lc to adjust a phase of the interpolator 201e2, so that the sampling clock signal lc may be aligned with a temporal position of the data signal data2. For example, an optimized temporal position may be found by scanning multiple interpolated phases. As illustrated in FIGS. 3A, 3B and 3C, in one embodiment, the phase interpolator 201e2 performs interpolation on the recovery clock signal ckr to generate a sampling clock signal lc, and the sampling clock signal lc may have sampling edges such as levels D0, E0, D1 shown in FIG. 3C. The first phase detector 201a detects phases of a sampling clock signal lc and an input data signal data2 to generate a first phase detection signal de1. Then, the fast-locking logic 201e1 of the fast-locking unit 201e receives the first phase detection signal de1 of the first phase detector 201a to find out an optimized phase and thus generate a phase signal phase_ctrl. The phase interpolator 201e2 receives the phase signal phase_ctrl to generate the sampling clock signal lc. For example, as shown in FIG. 3C, assume the sampling clock signal lc samples the data signal data2 at a position adjacent to a sampling edge to obtain values of Dn=1, En=1 and Dn+1=0, then the first phase detector 201a may determine whether the sampling clock signal lc is phase-lead or phase-lag, and the fast-locking unit 201e1 may advance or lag a phase of the sampling clock signal lc (such as by adjusting the phase signal phase_ctrl). In this embodiment, the phase of the sampling clock signal lc may satisfy the condition: Phase_ctrl(n)=phase_ctrl(n−1)+step, where phase_ctrl(n−1) denotes a current phase value, phase_ctrl(n) denotes a succeeding phase value of the sampling clock signal lc, and step denotes a phase adjustment value. Note a phase-leading sampling clock signal lc results in a positive value of "step", and a phase-lag sampling clock signal lc results in a negative value of "step". In this embodiment where the three sampling values adjacent to a sampling edge are Dn=1, En=1 and Dn+1=0, it is determined that the sampling clock signal lc needs to be lagged, as indicated in an elliptical dashed circle shown in FIG. 3B.

Accordingly, after the transition from a stall mode to a burst mode of the clock data recovery device 200, the fast-locking unit 201e may use a phase obtained in advance to select a phase of the sampling clock signal lc with respect to the recovery clock signal ckr to achieve fast-locking of the clock data recovery loop 201.

In an alternate embodiment, the fast-locking unit 201e may be an oversampling unit. Since the voltage-controlled oscillator 201c generates multiple recovery clock signals ckr having multiple phases such as eight phases, the information about edge positions and middle positions of data can be obtained relying on the multiple phases of the recovery clock signals ckr. Therefore, an optimized value can be obtained according to the multiple edge positions and middle positions of data to find out an optimized phase of the multiple phases, with the optimized phase serving as an initial phase of the sampling clock signal lc.

Figure 4A:
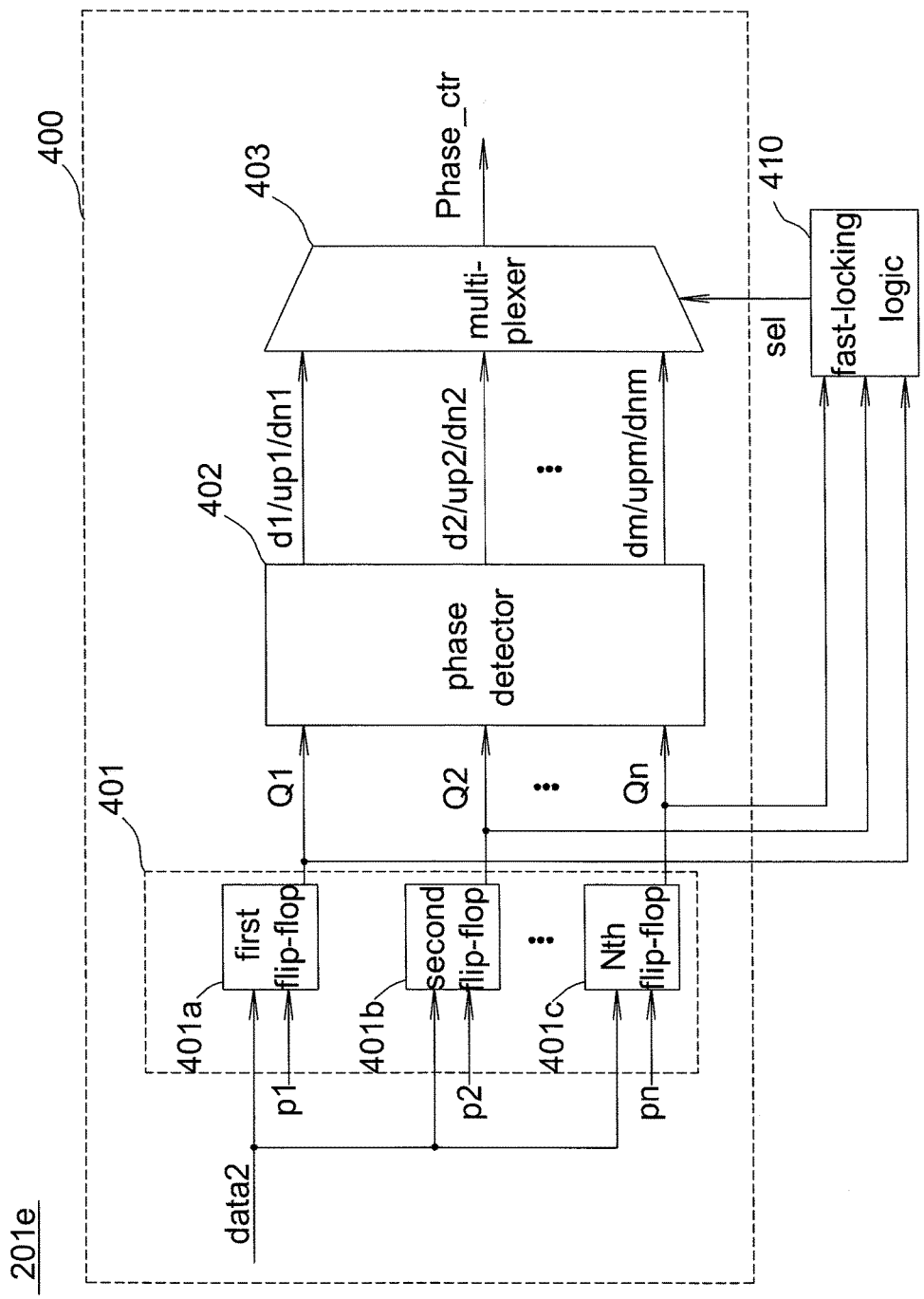
FIG. 4A shows a schematic diagram illustrating a fast-locking unit according to another embodiment of the invention.
Figure 4B:
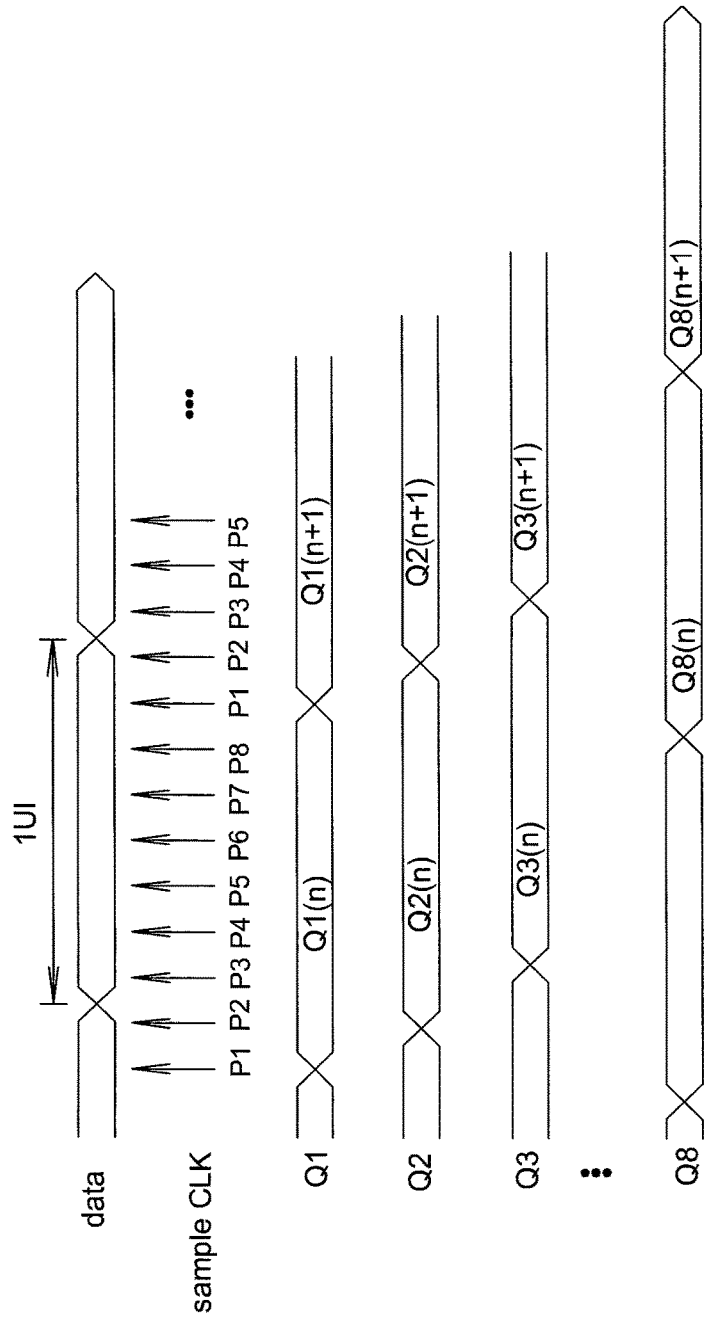
FIG. 4B is a logical flow diagram illustrating one embodiment of signal locking operations for the fast-locking unit of FIG. 4A.

In one embodiment, as shown in FIG. 4A, the fast-locking unit 201e may include an oversampling unit 400 and a fast-locking logic 410. The oversampling unit 400 includes a flip-flop circuit 401, a phase detector 402, and a multiplexer 403. The flip-flop circuit 401 includes multiple flip-flops 401a-401n. In one embodiment, assume the oversampling unit 400 uses eight sampling phases P1, P2, P3, P4, P5, P6, P7 and P8 of eight recovery clock signals ckr to sample one data signal data2 during a time length 1UI, eight sampled phases Q1, Q2, Q3, Q4, Q5, Q6, Q7 and Q8 are obtained. The fast-locking logic 410 receives the sampled phases Q1-Q8 to generate a selection signal Sel according to preset criteria. The phase detector 402 detects the sampled phases Q1-Q8 and recognizes respective correspondence relationships between the sampled phases Q1-Q8 and the data signals d1-d8 to generate result signals d1/up1/dn1-dm/upm/dnm that correspond to different positions of each of the eight data signals, such as an edge position and a middle position of data.

Figure 4C:
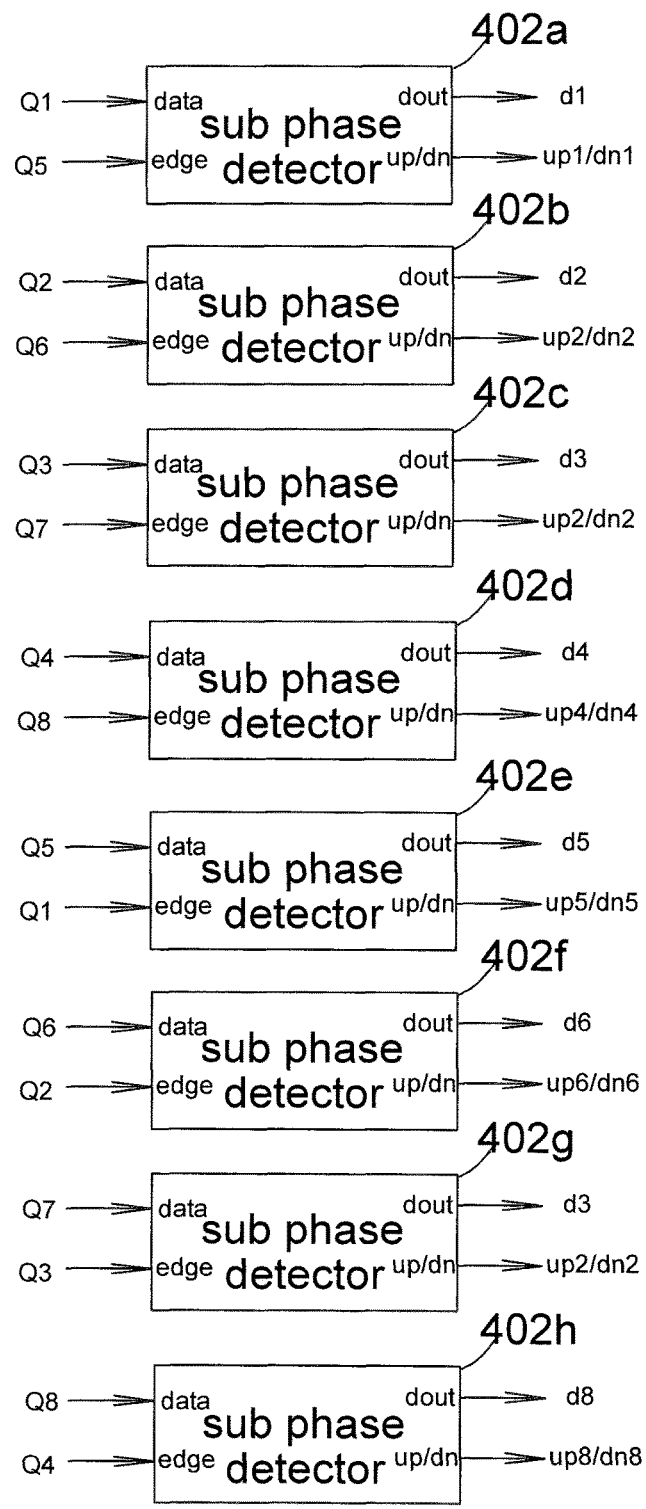
FIG. 4C shows a schematic diagram illustrating a phase detector of FIG. 4A according to an embodiment of the invention.

In one embodiment, as shown in FIG. 4C, the phase detector 402 may include multiple sub phase detector 402a-402h that are arranged and provided with signals in an order indicated in FIG. 4C. For example, the first sub phase detector 402a receives sampled phases Q1 and Q5 to generate a result signal d1/up1/dn1 whose truth table is shown in FIG. 4D. For example, in case Q1(n)=0(data(n)=0), Q5(n)=1(edge(n)=1) and Q1(n+1)=1(data(n+1)=1), it can be determined that phase Q1 is phase-lag compared with the data signal data2; that is, up(n)=1 and dn(n)=0.

Thereafter, the multiplexer 403 receives result signals d1/up1/dn1-dm/upm/dnm and selects one of the result signals d1/up1/dn1-dm/upm/dnm according to a selection signal sel to generate an output signal data_out/up/dn serving as a sampled data signal data_out and an input signal up/dn for the first charge pump 201b. Note, in one embodiment, the criteria for the selection of result signals d1/up1/dn1-dm/upm/dnm is to determine which result signal is nearest a value of a data signal corresponding to a middle position or other position of the data signal. Under the circumstance, after the transition from a stall mode to a burst mode of the clock data recovery device 200, the fast-locking unit 201e may use a phase obtained in advance to serve as an initial phase of the sampling clock signal lc to achieve fast locking of the clock data recovery loop 201.

Step S618: Turn off the fast-locking unit 201e, turn on the clock data recovery loop 201, and turn off the phase lock loop 202.

Step S620: Optionally decide whether to go to Step S610 to turn on the frequency tracking loop 203.

Figure 5:
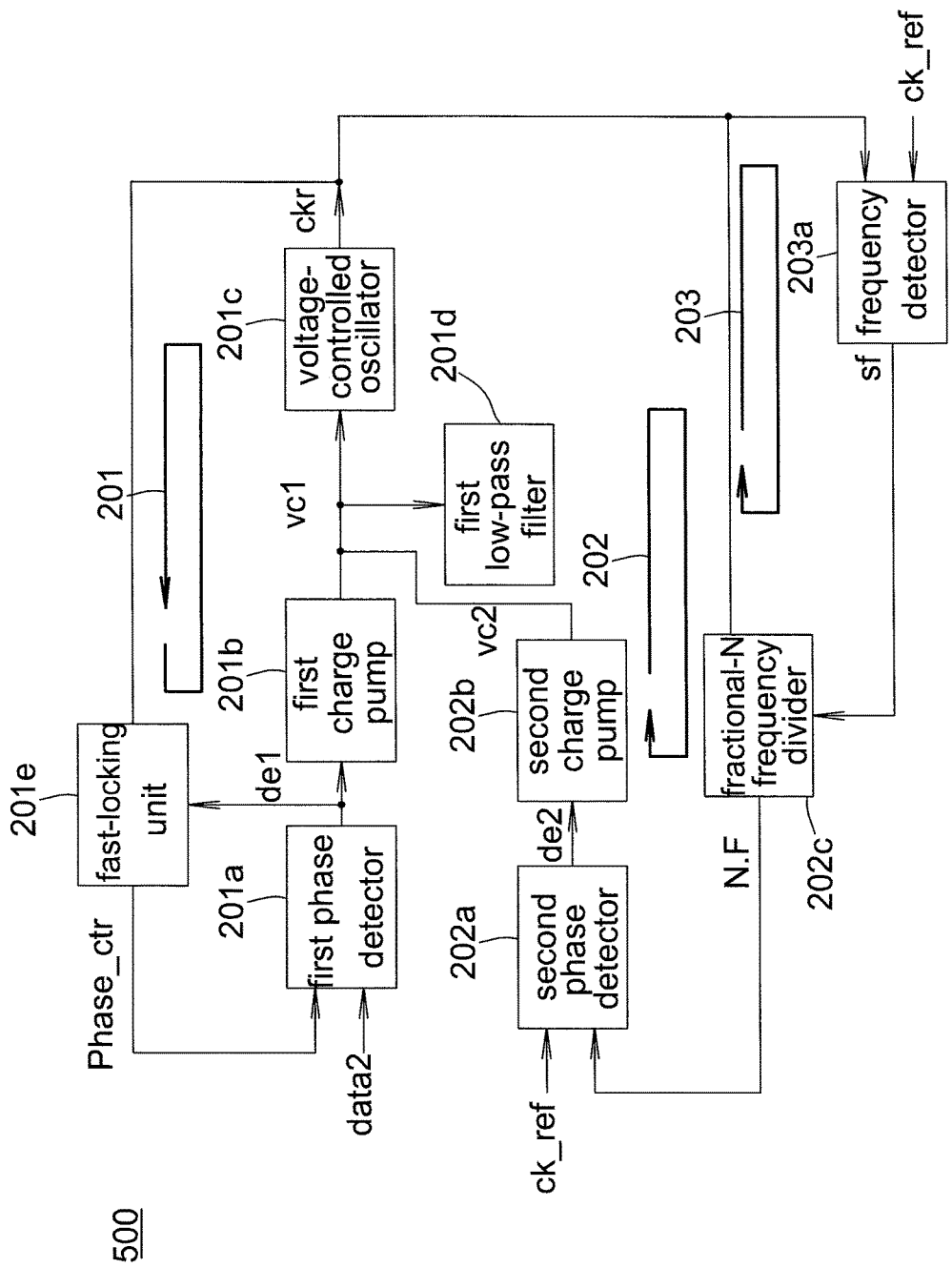
FIG. 5 shows a schematic diagram illustrating a burst mode clock data recovery device according to another embodiment of the invention.

FIG. 5 shows a schematic diagram illustrating a burst mode clock data recovery device 500 according to another embodiment of the invention. As illustrated in FIG. 5, the second low-pass filter 203b shown in FIG. 2 may be omitted from a clock data recovery device under certain conditions, such as in the case that the signal quality is not strictly demanded. The circuit architecture and operation principle of the burst mode clock data recovery device 500 is similar to the clock data recovery device 200 shown in FIG. 2, thus not explaining in detail here.

According to the above embodiments, since the fast-locking unit may select a phase in advance and select a voltage control signal corresponding to the selected phase, a voltage-controlled oscillator or a phase interpolator may generate the selected phase serving as an initial phase for an oscillation frequency of a clock data recovery circuit. As a result, the clock data recovery loop can be quickly locked to resolve the problems of conventional designs.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A clock data recovery device, comprising:
    a clock data recovery loop for receiving a sampling clock signal and a data signal and using the sampling clock signal to lock the data signal to generate a recovery clock signal;
    a frequency tracking loop coupled to the clock data recovery loop for tracking a frequency of the recovery clock signal to generate a frequency detection signal associated with the recovery clock signal;
    a phase lock loop coupled to the clock data recovery loop and the frequency tracking loop for receiving the frequency detection signal and locking the recovery clock signal in a reference clock; and
    a fast-locking unit coupled to the clock data recovery loop for generating a fast-locking signal under a burst mode according to the recovery clock signal and a first phase detection signal to allow the clock data recovery loop to lock the data signal after the transition from a stall mode to the burst mode.

2. The device as claimed in claim 1, wherein the clock data recovery loop comprises:
    a first phase detector for detecting a phase difference between the sampling clock signal and the data signal to generate the first phase detection signal;
    a first charge pump for generating a voltage control signal according to the first phase detection signal;
    a voltage-controlled oscillator for generating the recovery clock signal according to the voltage control signal; and
    a first low-pass filter for performing a low-pass filtering operation on the voltage control signal.

3. The device as claimed in claim 2, wherein the fast-locking unit is a phase interpolator, the phase interpolator performs interpolation on the recovery clock signal to generate the sampling clock signal and relies on the first phase detection signal of the first phase detector to recognize phase-leading or phase-lag of a sampling position of the data signal to adjust a phase of the sampling clock signal, so that the sampling clock signal is allowed to be aligned with a temporal position of the data signal.

4. The device as claimed in claim 3, wherein the fast-locking unit scans multiple phases of multiple sampling clock signals and finds out a phase of the multiple phases substantially aligned with the temporal position of the data signal.

5. The device as claimed in claim 2, wherein the fast-locking unit is an oversampling device, the oversampling device uses multiple phases of multiple recovery clock signals generated by the voltage-controlled oscillator to fetch the data signal and obtain multiple edge positions and middle positions of data of the data signal, selects a phase of the multiple phases according to the multiple edge positions and middle positions of data, and select a voltage control signal corresponding to the selected phase to generate the recovery clock signal.

6. The device as claimed in claim 2, wherein the phase lock loop comprises:
    a second phase detector for receiving the reference clock and a frequency division signal and generating a second phase detection signal according to a phase difference between the reference clock and the frequency division signal;
    a second charge pump for generating a voltage control signal according to the second phase detection signal; and
    a fractional-N frequency divider for receiving the recovery clock signal and the frequency detection signal and generating the frequency division signal according to the recovery clock signal and the frequency detection signal.

7. The device as claimed in claim 6, wherein the frequency tracking loop comprises:

a frequency detector for receiving the reference clock and detecting a frequency of the recovery clock signal relying on the reference clock to generate the frequency detection signal.

8. The device as claimed in claim 6, wherein the frequency tracking loop further comprising:
a second low-pass filter for performing a low-pass filtering operation on the frequency detection signal.

* * * * *